United States Patent
Coenen

(10) Patent No.: US 7,253,516 B2
(45) Date of Patent: Aug. 7, 2007

(54) ELECTRONIC DEVICE AND CARRIER SUBSTRATE FOR SAME

(75) Inventor: Martinus Jacobus Coenen, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/574,882

(22) PCT Filed: Oct. 1, 2004

(86) PCT No.: PCT/IB2004/051945

§ 371 (c)(1),
(2), (4) Date: Apr. 6, 2006

(87) PCT Pub. No.: WO2005/036643

PCT Pub. Date: Apr. 21, 2005

(65) Prior Publication Data

US 2007/0018287 A1  Jan. 25, 2007

(30) Foreign Application Priority Data

Oct. 10, 2003  (EP) .................................. 03103758

(51) Int. Cl.
*H01L 23/12* (2006.01)

(52) U.S. Cl. .............. 257/724; 257/723; 257/691; 257/773; 257/776; 257/780; 257/782; 257/784; 257/786; 257/E23.001; 257/E23.015; 257/E23.02; 257/E23.06; 257/E23.079; 257/E23.153

(58) Field of Classification Search ............... 257/691, 257/693, 698–724, 733–739, 773–786, E23.001–E23.194
See application file for complete search history.

(56) References Cited

U.S. PATENT DOCUMENTS

| 5,741,729 A | * | 4/1998 | Selna ........................ 438/125 |
| 6,448,639 B1 | | 9/2002 | Ma |
| 6,509,646 B1 | | 1/2003 | Lin et al. |
| 6,779,783 B2 | * | 8/2004 | Kung et al. .................. 257/780 |
| 6,930,381 B1 | * | 8/2005 | Cornelius .................... 257/692 |
| 2002/0017399 A1 | | 2/2002 | Chang et al. |
| 2002/0153605 A1 | | 10/2002 | Chang |

FOREIGN PATENT DOCUMENTS

| EP | 0 743 929 | 7/1998 |
| WO | WO 96/23320 | 8/1996 |
| WO | WO 01/15182 | 3/2001 |
| WO | 2004-064151 | 7/2004 |

\* cited by examiner

*Primary Examiner*—Jasmine Clark
(74) *Attorney, Agent, or Firm*—Peter Zawilski

(57) ABSTRACT

Consistent with an example embodiment, an electronic device comprises an integrated circuit and a carrier substrate with a bottom and top conductive layer, and is provided with voltage supply, ground and signal transmission connections. In order to enable the use of more than one supply voltage, the integrated circuit is subdivided into core functionality and peripheral functionality, and the carrier substrate is subdivided into a corresponding core area and peripheral area. The ground connections of both core and periphery are mutually coupled through an interconnect in the carrier substrate. This interconnect is particularly a ground plane, and allows the provision of a transmission line character to the interconnects for signal transmission of the periphery.

8 Claims, 8 Drawing Sheets

ELECTRONIC DEVICE AND CARRIER SUBSTRATE FOR SAME

The invention relates to an electronic device comprising:

at least one semiconductor device provided, on a side, with a plurality of bond pads; and a carrier substrate of dielectric material having a first side and an opposed second side, which are each provided with an electrically conductive layer, on which first side bond pads are present which are suitable for coupling to the bond pads of the at least one semiconductor device, and on which second side contact pads for external coupling are provided, the contact pads and the bond pads being electrically interconnected according to a desired pattern, a first portion of the contact pads being defined for ground connection, a second portion of the contact pads being defined for voltage supply connection and a third portion of the contact pads being defined for signal transmission.

The invention also relates to a carrier substrate for such an electronic device.

Such an electronic device and such a carrier substrate are known from U.S. Pat. No. 6,448,639. The known device is known as a ball grid array package. This type of package is well known for a variety of integrated circuits, and has as main advantages: easy placement on an external carrier with solder balls, and the ability to provide a very large number of contact pads, and thus very many signal connections, generally known as I/O paths. The known carrier substrate is provided with two electrically conducting layers, which has the advantage of reducing the cost price of such a package. The first and second portions of the contact pads for ground and voltage supply connection are disposed right under the corresponding bond pads on the first side of the carrier substrate. These bond pads are embodied as concentric ground and power rings. Due to this construction the connections between the bond pads and the corresponding contact pads are short, which leads to a reduced parasitic inductance and thus to a better electrical performance.

It is a drawback of the known device that it is to be supplied with a single supply voltage. Particularly for integrated circuits that allow signal processing in both analog and digital manners, the so-called mixed-signal ICs, it is preferred to have more supply voltages. This is also advantageous for other integrated circuits, in that different functions in the integrated circuit can be provided with a supply voltage suitable for the respective function. Otherwise there is a mismatch between supply voltage and function, which leads to enhanced thermal dissipation and overvoltage stress due to the low insulation thickness of h the gate oxide. Thermal management is however one of the main problems in current integrated circuit design, and enhanced thermal dissipation is undesirable.

It is therefore a first object of the invention to provide an electronic device of the kind mentioned in the opening paragraph, comprising means for the provision of different supply voltages, which nevertheless exhibit a limited parasitic inductance as a consequence of the interconnects in the carrier substrate.

It is a second object to provide a suitable carrier substrate for such an electronic device.

The first object is achieved in that:

the at least one semiconductor device is provided with core functionality and peripheral functionality, the core functionality and the peripheral functionality each being provided with voltage supply connection and ground connection, the carrier substrate is laterally subdivided into a core area and a peripheral area, in which core area the contact pads for the core functionality are provided and in which peripheral area the contact pads for the peripheral functionality are provided, the carrier substrate is provided with at least one interconnect for interconnecting the ground connections of the peripheral functionality and the core functionality, and means for decoupling the voltage supply of the core and the peripheral functionality to the common ground are present.

The second object is achieved in the carrier substrate thus defined.

The device of the invention enables a distinction to be made between core and peripheral functionality, and this distinction is present not only in the semiconductor device, but is also physically implemented in the carrier substrate. In this manner any cross-talk is prevented between the peripheral and the core functionality by using a star-point principle. Additionally, there is provided a connection between the grounds of the different functionalities within the carrier substrate. This implementation of the connection in the carrier substrate reduces the parasitic inductance in comparison with an implementation in an external carrier. The connection in the carrier substrate is furthermore important to enable the transmittal of signals between core and peripheral functionality. A requirement for this purpose is that the clocks and other data signals of both functionalities are coupled, since otherwise simultaneous actions would not be possible. For this purpose, also the means for decoupling are provided. It has turned out that this coupling of both functionalities through the external carrier is too slow for the high speeds and operating frequencies of particularly integrated circuits which are implemented with advanced IC technologies, particularly technologies with a channel length of 0.18 µm or less. On the other hand, if there is no coupling of both functionalities within the semiconductor device, a very high sensitivity to electrostatic discharge (ESD) occurs, particularly in combination with the use of bondwires. The solution of the invention does not have such disadvantages.

It is thus achieved that the device exhibits good behavior with limited parasitic inductance and enables the use of different supply voltages. At the same time, any communication within the device between different parts thereof is not hampered. Furthermore, the carrier substrate can be embodied so as to comprise the limited number of only two conductive layers.

In a preferred embodiment, the peripheral area is located around the core area, and a ground plane is defined in the peripheral area on the second side of the carrier substrate. This ground plane thus is the interconnect for interconnecting the ground connections of the peripheral functionality and the core functionality. Furthermore, interconnects between the contact pads and the bond pads of the peripheral functionality are defined on the first side of the carrier substrate, which interconnects have a properly defined transmission line character by a single track over a ground reference plane.

The device of this embodiment has a number of further advantages. The transmission line character of the interconnects reduces the parasitic inductance by at least 90%, and generally more. In this manner, the effective parasitic inductance within the peripheral area is substantially equal to that of the core area This allows to use a carrier substrate of any desired size, and there are no limits regarding the number of contact pads.

Furthermore, particularly for flip-chip embodiments, it is an advantage that the number of structures for ESD-protection in the core area is reduced. The metal or solder balls between the carrier substrate and the integrated circuit have a height of about 30 µm in general, and thus provide a good definition of the voltage potential. As a consequence, not all contact pads for voltage supply connections need to be provided with ESD-protection structures, but only those at the outer edge of the core area Additionally, there are no staggered pads needed on the first side of the carrier substrate. A single row of bond pads can be used to connect the peripheral functionality, as the need for the core voltage supply pads has diminished.

In order to obtain the transmission line character of the interconnects, not only the ground plane is needed. Additionally, the dielectric thickness between an interconnect and the ground plane should be smaller than that between neighboring interconnects on the first side of the carrier substrate. This can be achieved by enlarging the dielectric constant of the material of the carrier substrate to control crosstalk.

The material of the substrate can thus be a suitable material such as polyimide, polymer-strengthened glass fibers, FR-4 (an epoxy resin), FR-5 and BT-resin. Alternative materials include such materials filled with particles with a relatively high dielectric constant (such as perowskite type materials), ceramic materials including $SiO_2$, Al—C—O—N, materials obtainable by sintering a matrix of thermally conductive material with embedded semiconductor particles. Particularly the combination of matrix materials and embedded particles is preferred, as this allows optimization of a range of parameters, including the dielectric constant, the coefficient of thermal expansion, the mechanical strength and the thermal conductivity. Examples are given in WO01/15182, EP-A 743929, EP03075079.8 (PHNL030040, not prepublished). The choice of the material is rather wide as no internal conductors are needed.

A further and additional measure to get the transmission line character is the reduction of the thickness of the carrier substrate. Also, the distance between neighboring tracks is made as uniform as possible. Besides, the bond pads on the first side of the carrier substrate are defined at the periphery of the core area. The specific location is of course dependent on whether wirebonding or flip chip is used for the connection between substrate and integrated circuit. However, the prior art document shows that there are bond pads on the first side of the carrier substrate which are at a substantial distance from the edge of the integrated circuit and require a considerable bond length. This is not desired in the device of the invention, as the different bond lengths negatively affect the transmission line character and are not uniform for all interconnects.

In a further preferred embodiment the means for decoupling comprise a number of decoupling capacitors coupled between the voltage and ground connections of the peripheral functionality. Such a decoupling capacitor is needed in addition to an on-chip capacitor in order to maintain the transmission line character behavior of the interconnect during charging of the load capacitor. Preferably, the capacitors are provided such that any external carrier is free from decoupling capacitors in the same position at the substrate.

The decoupling capacitor will not be provided on the external carrier. Such a location will allow currents within the core functionality to flow from the integrated circuit through the carrier substrate to the external carrier. A first alternative location is in the semiconductor device, and often the integrated circuit. Particularly near the edge of the integrated circuit, where generally the plurality of bond pads is provided, there is sufficient space left as a consequence of design rules. This space can be used for such capacitors without the need to enlarge the surface area of the integrated circuit. A second alternative location is on the first side of the carrier substrate, between bond pads for the voltage supply and the ground of the core functionality. Suitably, small sized capacitors, such as those known as [0402]-format, can be assembled to the board. Such discrete capacitors are preferably used in addition to decoupling capacitors in the integrated circuit, as the total inductance in series will be substantially higher than in the case of on-chip decoupling capacitances. This second alternative is particularly relevant for an embodiment in which wirebonding is applied.

In a further embodiment, the contact pads in the core area are defined in an array, the pads for ground connection and for supply connection being distributed in the array such that each of the pads for ground connection has pads for supply connections as its closest neighbor pads. In this embodiment, the pads for ground connection and supply connection are defined in a 'chessboard' pattern. As a consequence, the supply connection of the core functionality functions as a coaxial center conductor. The effective inductance for each of the power paths is thus reduced by the mutual inductance between the voltage supply and ground connections in the core. This results in a lower ground bounce voltage, which is the dynamic voltage difference between the ground plane in an external carrier and the ground connection to the core. The effective inductance of the ground connection path will be lowered by more than 50%. Furthermore, this pattern allows for handling of substantially large DC currents. An array of 10 by 10 pads in the core area can handle DC currents up to more than 4 Ampére, which is sufficient for integrated circuits made in a technology with a channel length of only 120 nm and below.

In another embodiment, the contact pads in the peripheral area are defined in subgroups, each subgroup comprising one contact pad for voltage connection or one contact pad for ground connection, and several contact pads for signal transmission, all of the pads for signal transmission having the contact pad for either voltage or ground connection as a neighboring pad. Particularly, the contact pad for voltage or ground connection will be the center ground pad of the group. This subdivision into subgroups allows that there is a minimum distance between a signal path in one direction and a signal path in the reverse direction (the contact pad for either ground or voltage supply). Such a subdivision is particularly important to enforce a proper transmission path from the carrier substrate to an external carrier. Its implementation is thus needed at the level of the solder balls for placement of the device on an external carrier, and hence in the contact pads on the second side of the carrier substrate.

In a further embodiment, the ground plane is defined in the core area on the first side of the carrier substrate and coupled to the ground plane in the peripheral area through vertical interconnects. This is in fact a practical implementation. By virtue thereof there is sufficient space for the solder balls on the second side of the carrier substrate.

It is preferred for improvement of the mechanical stability, that a stiffener layer is present on the first side of the carrier substrate, thereby covering part of the electrically conductive layer. The transmission line character of the interconnects leads to a reduction of the thickness of the carrier substrate to 100 or 50 µm or potentially even less to obtain the desired transmission line characteristics. In order that the device nevertheless has the desired mechanical stability, an encapsulation could be applied. This is however not preferred for reasons of thermal management. Furthermore, if bond wires are used, they need to be attached to a carrier which is not very stable. The use of a dielectric stiffner, which leaves the bond pads on the first side exposed, is a practical solution. It is preferred but not necessary that the dielectric stiffner is made from the same material as the dielectric material of the carrier substrate. Dependent on the stiffner material used, an additional spacer may be needed to maintain the transmission line characteristics.

The electrical connections between the bond pads on the carrier substrate and the integrated circuit are nowadays generally provided using either wirebonding or a flip-chip technique. In the embodiment with wirebonds, the contact pads for the voltage supply and ground connection of the core functionality are suitably implemented as concentric rings. These rings allow the placement of discrete decoupling capacitors as stated above.

In the embodiment with flip chip, the integrated circuit is placed on the carrier substrate in a flip chip orientation. The bond pads at the integrated circuit and on the first side of the carrier substrate are positioned in a corresponding configuration. Preferably a heat spreading layer is provided on the first side of the carrier substrate and on a side of the integrated circuit facing away from the side of the bond pads. Such a heat spreading layer is suitably attached, not directly to the substrate but on top of the dielectric stiffner or any other spacer layer.

As mentioned above, the embodiment with flip chip and the implementation of the core area laterally within the peripheral area, has substantial advantages. First of all, no staggered pads are needed, as core supply pads at the perimeter are no longer necessary. Secondly, any solder balls between the bond pads of integrated circuit and carrier substrate will define a good potential for the core area. As a consequence, the amount of ESD-protection structures needed in the core area is substantially reduced. Furthermore, no redistribution layer is needed, as the contact pads on the first side of the carrier substrate (particularly those for the voltage supply of the core) can be made in the conductive layer on that side. Another advantage of the flip-chip version is the low IR drop, or voltage drop. An IR drop of 10% was allowed for old CMOS processes, whereas it is only 5% for advanced IC processes with a channel length of 0.18 μm or less. However, the average supply current increases on decreasing the supply voltage for those advanced IC processes. By parallel switching of the package interconnect, at least for the core, the IR drop on the IC is diminished.

In an even further embodiment the device is further provided with a supply series inductor. Such a series inductor preferably has a magnitude in the range of 0,5-1,0 μH. It is a nice implementation to sustain operation over a clock period. Preferably, the inductor is provided as a discrete component at the external carrier, and more preferably within an area corresponding to the core area. Alternatively, the inductor can be integrated in either the external carrier or the carrier substrate. Preferably, the dielectric material is then suitably provided with magnetic particles, for instance of a ferrite material, such as to enhance this inductance.

It is observed that the electronic device of the invention comprises at least one semiconductor device. Generally, this semiconductor device is an integrated circuit. Alternatively, more than one semiconductor device may be provided, such as an integrated circuit and diodes; an amplifier and a transceiver; an amplifier and other RF components such as filters and antenna switches; or a first and a second integrated circuit. In the case of two integrated circuits, the core functionality may be present in the first integrated circuit, and the peripheral functionality may be present in the second integrated circuit.

As will be understood by the skilled person, the core functionality includes for instance digital signal processing, embedded memory, encoder/decoder modules and other standard cell implemented functionalities. The peripheral functionality includes for instance digital and analog inputs and outputs, oscillator couplings, PLL and bandgap decouplings, RF input and outputs.

These and other aspects of the device and the carrier substrate of the invention will be further explained with reference to the Figures, in which.

Figure 1:
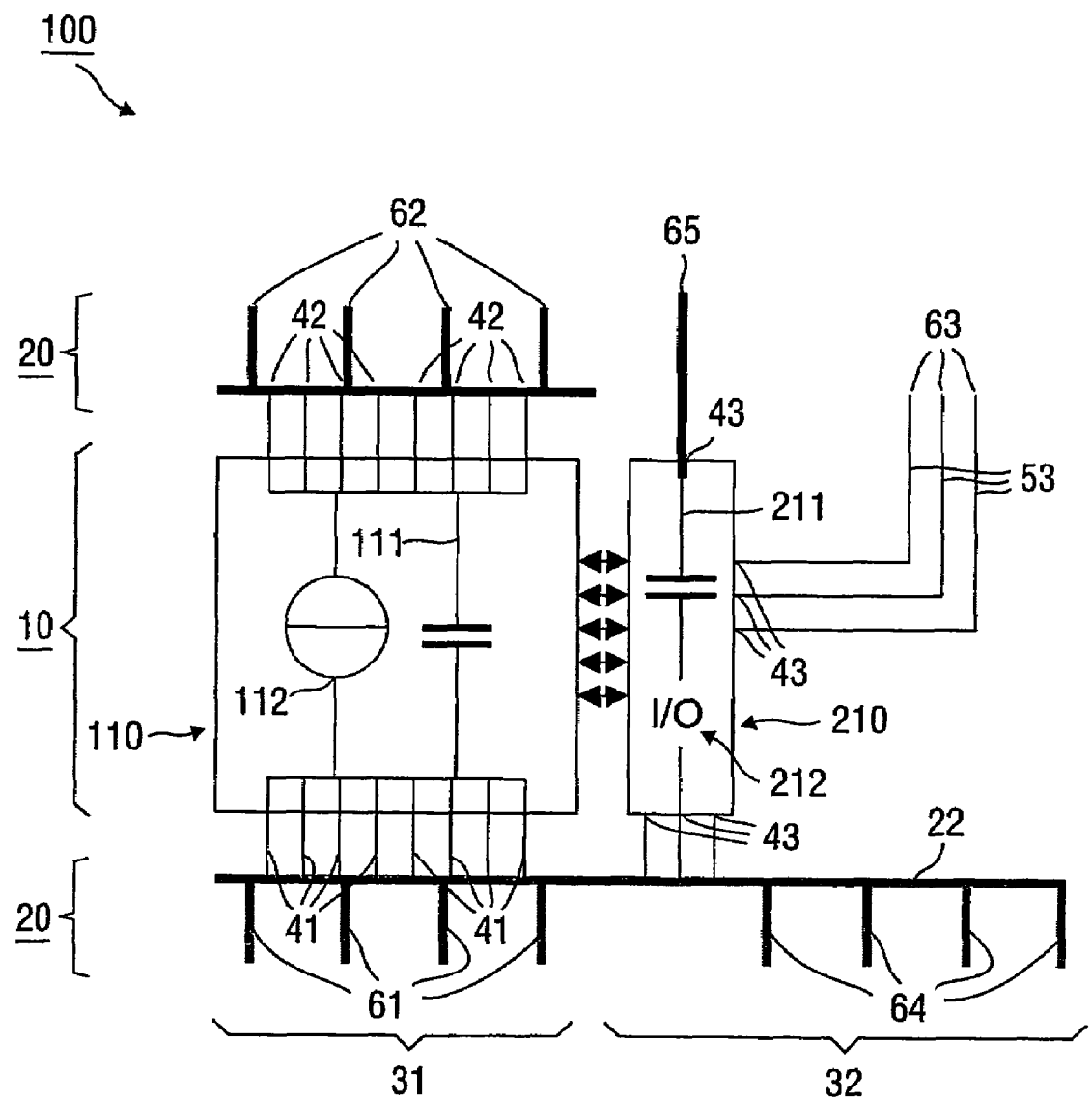
FIG. 1 shows a diagram of the device of the present invention.

The Figures are not drawn to scale and equal reference numerals refer to similar or equal parts. The Figures show preferred embodiments, but many modifications hereof will be apparent to the skilled person.

FIG. 1 is a graph in which the device 100 of the present invention is depicted. The device 100 comprises a semiconductor device 10, which in this case is an integrated circuit. The semiconductor 10 comprises a core functionality 110 and a peripheral functionality 210. The device 100 further comprises a carrier substrate 20, that is provided with a core area 31 and a peripheral area 32. The core functionality 110 comprises the active elements 112 as well as a decoupling capacitor 111, and is provided with voltage supply connections 42 and ground connections 41. By means of the supply decoupling topology with the core decoupling, the contribution to ground bounce, i.e. RF emission from the core can be reduced effectively.

The peripheral functionality 210 comprises I/O means 212 and means for decoupling 211, in this case a decoupling capacitor placed in series with the I/O means 212. The peripheral functionality 210 is further provided with connections 43, for voltage supply, ground and signal transmission. The ground connections 41, 43 of the peripheral and the core functionality 110, 210 are interconnected through an interconnect 22 in the carrier substrate 20. The means for tuning 211 is necessary herein to stabilize the behavior, as will be explained with reference to FIG. 2. The carrier substrate 20 further comprises contact pads 61, 62, 63, 64, 65 for connections to a printed circuit board.

Figure 2:
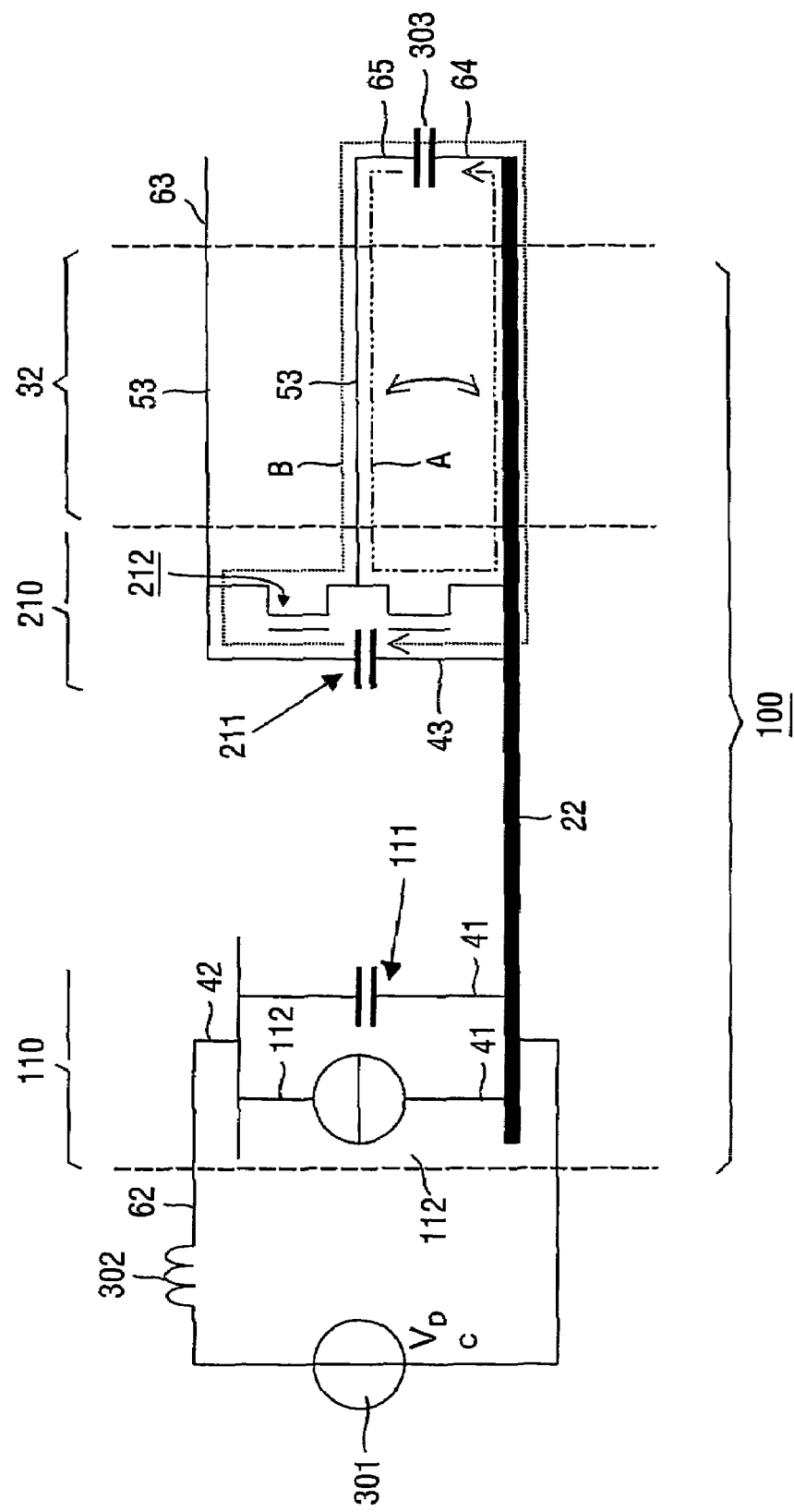
FIG. 2 shows a further diagram of the device of the present invention, that explains the electrical performance.

FIG. 2 shows another graph in which the device of the present invention 100 and additional parts are shown, which will generally be embedded in or provided on a printed circuit board. It is shown in this graph that the common ground 22 connects the core functionality 110 and the peripheral functionality 210. Additionally, the need for the tuning means 211 is shown. By means thereof the transmission line character of the interconnects 53 is enabled. The tuning means are in this case provided as on-chip decoupling means between the voltage supply and ground connections of the peripheral functionality. The capacity of this decoupling capacitor is for instance in the order of 1 nF. The external parts are, in this case, a voltage source 301 and an inductor 302, that provide an adequate voltage to the core functionality 110. Additionally, there is a capacitor 303 of the load, that is coupled between ground and voltage supply of the peripheral functionality.

As shown in this FIG. 2, current may flow in two directions A and B, and in each of these directions the transmission line character of the interconnects should be maintained for adequate operation. In one situation the capacity of the load 303 is discharged. The current flows in this situation counter-clockwise, as shown under A. As there is current in both the interconnect 53 and the ground 22, the transmission line character is present In the other situation the capacitor of the load 303 is charged. In this case, the decoupling capacitor 211 allows flow of the current according to B. Again, there is current in both the interconnect 53 and the ground 22, and the transmission line character is established.

Thus, the RF content of the signals 63 which should flow through the voltage supply connection to the load 212 can bypass to the ground connection, and then supply its signal to the load using the transmission line between the ground and the interconnects for signal transmission. Then, using the load 212, nearby or on-chip decoupling should be present between the voltage supply and ground connections of the periphery to allow the same signal flow condition at the receiver's, i.e. load, end. In this manner, by means of supply decoupling topology with the peripheral decoupling, the contribution to ground bounce i.e. RF emission from the peripheral area can be reduced effectively. Furthermore, by enforcing a proper transmission-line path between the contact pads for signal transmission 63 and the corresponding bond pads on the integrated circuit 10, the effective inductance in the carrier substrate 20 can be kept low, which reduces cross-talk between the core and peripheral currents. As a result, both a good signal integrity and an adequate EMC performance are achieved.

Figure 3:
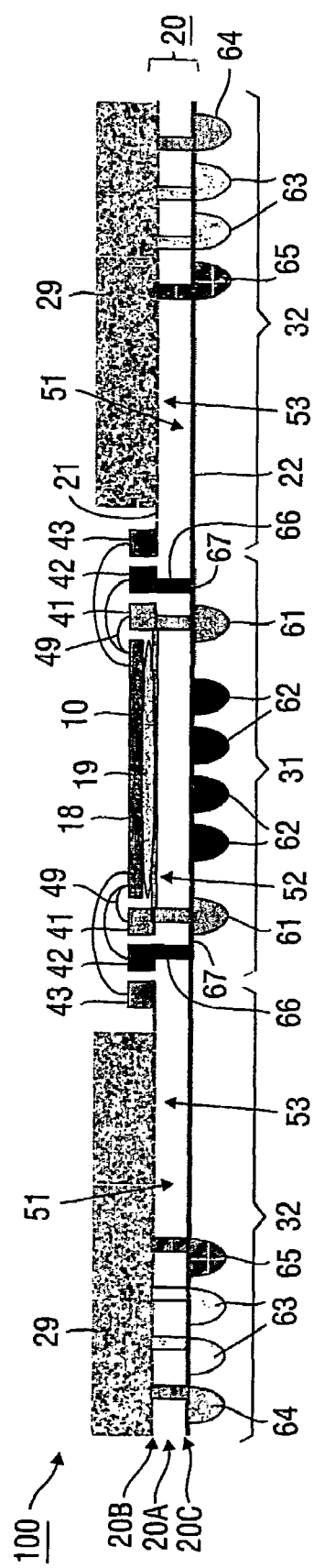
FIG. 3 shows diagrammatically a cross-sectional view of a first embodiment of the device.
Figure 4:
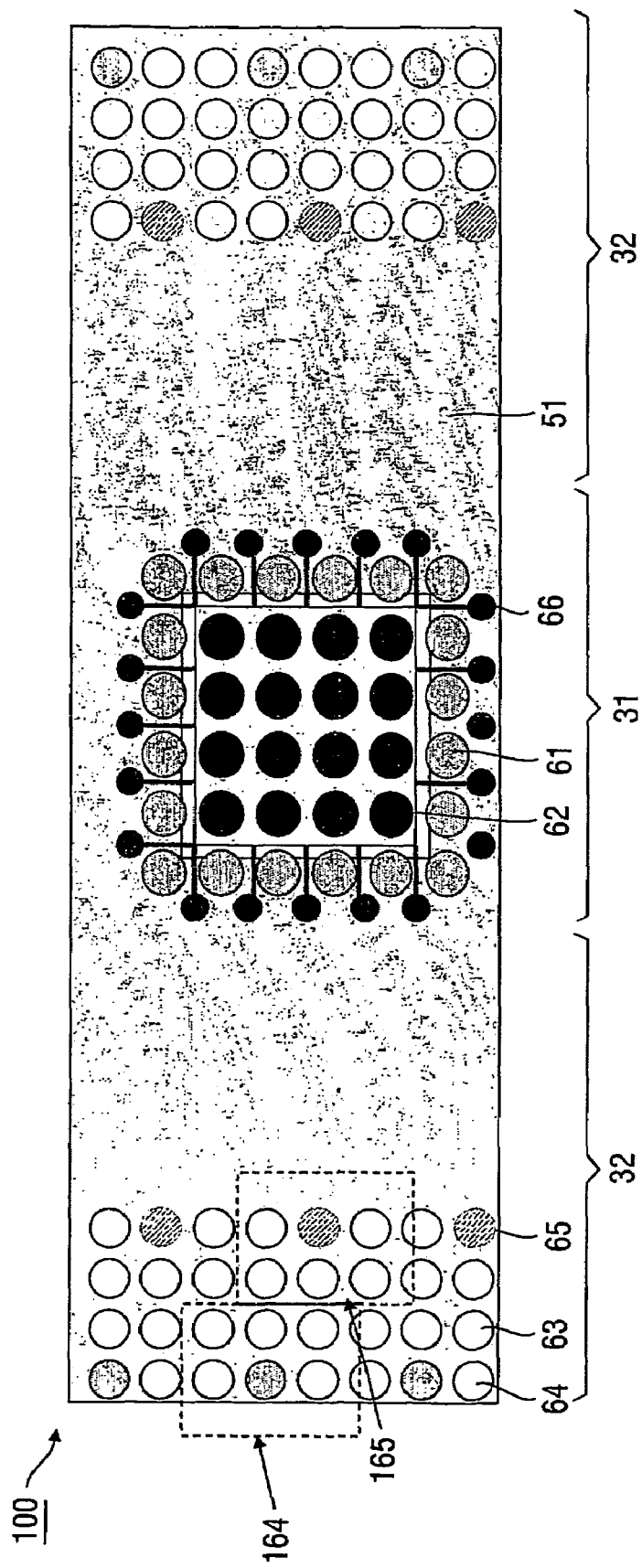
FIG. 4 shows diagrammatically a bottom view of the first embodiment.
Figure 5:
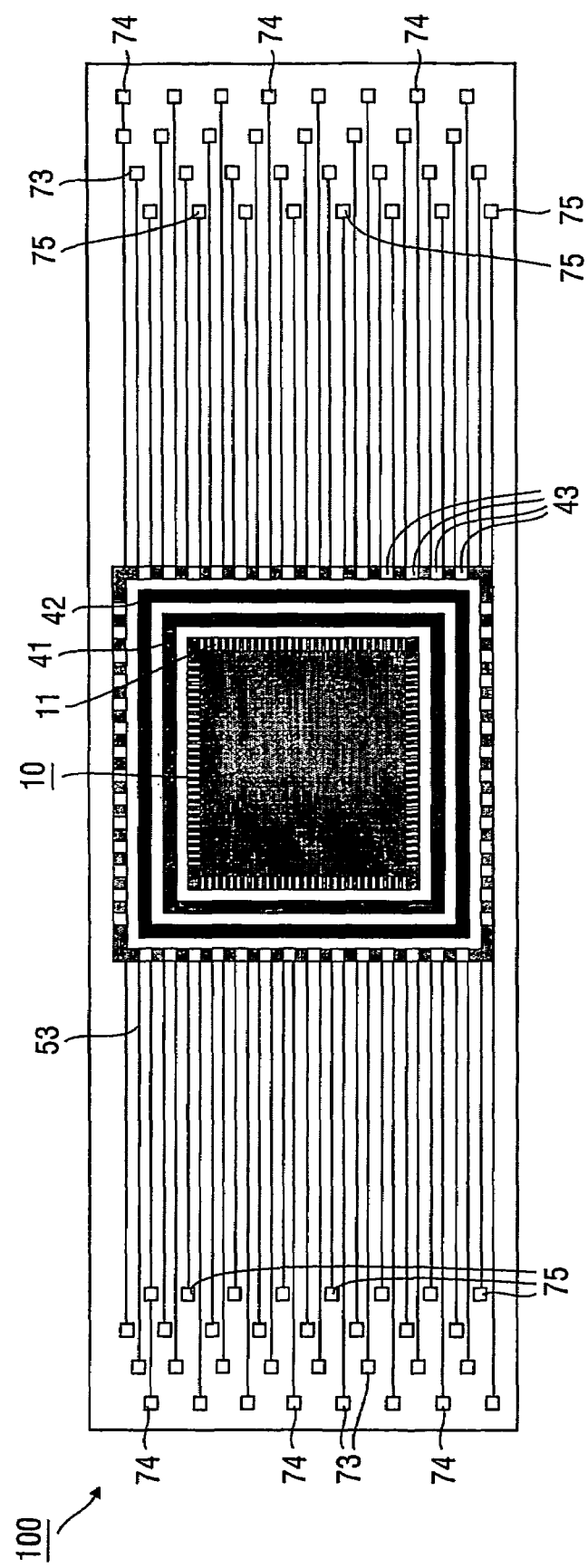
FIG. 5 shows diagrammatically a top view of the first embodiment.

FIG. 3 shows a cross-sectional view of a first embodiment of the device 100 of the invention. FIG. 4 shows the device 100 of this embodiment from the second side of the carrier substrate 20, on which side the contact pads 61-65 for external connection are present FIG. 5 shows the device 100 of this embodiment from the first side of the carrier substrate 20, on which side the integrated circuit 10 is provided. It is observed that in FIGS. 4 and 5 only parts of the substrate are shown; the substrate usually extends laterally, and the contact pads 63-65 generally form a closed ring around the integrated circuit. The embodiment thus is an example of a typical ball grid array package, as the skilled person will understand. Such a package is preferred, but the invention is not limited thereto. It is furthermore observed that in FIG. 5 the mechanical stiffner 29 is left out for reasons of clarity. It is also observed that FIG. 3 is not a true cross-section, as will be apparent from a comparison with FIG. 4.

The device as shown in FIG. 3 comprises an integrated circuit 10 and a carrier substrate 20. The carrier substrate 20 has a first side 21 and a second side 22. It comprises a body 20A of dielectric material and electrically conducting layers 20B, 20C on the first and second side 21, 22, respectively. The dielectric material in this case is an epoxy resin (FR-4) with a thickness of about 80 μm, and the electrically conducting materials are made of copper. The resolution of interconnects and other tracks defined in the copper is in the order of 50 μm, and there is a minimal distance between neighboring tracks of 100 μm, in this embodiment. On the first side 21 a mechanical stiffening layer 29 is present, which provides additional mechanical stability. The stiffening layer 29 has in this case a thickness of about 300 μm and is made of the same material as the body 20A.

The integrated circuit 10 has a first side 18 on which bond pads 11 are provided (see FIG. 5). In this embodiment the bond pads 11 are connected via wirebonds 49 to the bond pads 41, 42, 43 on the first side 21 of the carrier substrate 20. These bond pads 41-43 are provided with an additional thickness as compared to the electrically conducting layer 20B, which additional thickness is meant for mechanical stability during the wirebonding and provided by electroplating in known manner.

The integrated circuit in the invention is provided with core functionality and with peripheral functionality. In the invention, separate areas are defined in the carrier substrate 20 for each of the functionalities: a core area 31 for the core functionality and a peripheral area 32 for the peripheral functionality. In the embodiment the peripheral area 32 is positioned laterally around the core area 31. This is preferred, but not necessary. Specific bond pads are present on the first side 21 of the carrier substrate 20 for the core functionality 42 and the peripheral functionality 43. The bond pads for the peripheral functionality 43 include the bond pads for signal transmission and voltage supply. The bond pads for the core functionality 42 include the bond pads for the voltage supply. In addition, there are bond pads for ground connections 41, which are common for the core and peripheral functionality. The bond pads for ground connection 41 and for voltage supply of the core functionality 42 are implemented in this embodiment as concentrical rings, with the ring for ground inside the ring for power.

The core area 31 and the peripheral area 32 of the carrier substrate 20 are designed differently. In the core area 31, the bond pads 41, 42 on the first side 21 are directly connected to the second side 22, so as to minimize inductive losses. The contact pads 61 for ground connection are positioned directly below the corresponding bond pads 41. In order to have a ground that is as standardized as possible, the bond pads 41 for ground are interconnected through a ground plane 52 on the first side 21 of the carrier substrate 20. The contact pads 62 for voltage supply connection are coupled to the corresponding bond pads 42 through interconnects 67 on the second side 22 of the carrier substrate 20 to the vertical interconnects 66. In this embodiment, each contact pad 62 for voltage supply connection is provided with a (non-shown) ESD protection structure. The center-four contact pads 62 are primarily meant for improvement of the thermal behavior of the package.

The peripheral area 32 of the carrier substrate 20 is provided with a ground plane 51 on its second side 22. On the first side 21 interconnects 53 are defined so as to connect the bond pads 43 with corresponding contact pads 63, 65. Due to the presence of the ground plane 51 on the second side 22, and a mutual distance between neighboring interconnects 53 that is preferably larger than the thickness of the body 20A, the interconnects 53 behave as transmission lines. As a result, their inductive losses are reduced by at least 90%, and generally even about 95%.

The interconnects 53 end up at vertical interconnects 73, 75, as shown in FIG. 5. The interconnects 75 correspond to the contact pads 65 intended for voltage supply connections of the peripheral functionality. The interconnects 73 correspond to the contact pads 63 used for signal transmission. Additionally, there are also contact pads 64 for ground connections of the peripheral area 32. These contact pads 64 are connected to their bond pads 41 through the ground plane 51 on the second side 22 of the carrier substrate 20. The contact pads 64 for ground are positioned at the outer periphery of the contact pads array, generally a ball grid array. This provides some protection against electromagnetic inference.

Some of the contact pads 65 meant for voltage supply connections could be used for ground connections. This is a matter of design and depends on the required number of voltage supply connections and ground connections to an external carrier. It is however preferred that the contact pads 63-65 are subdivided into subgroups 164, 165. In the subgroups 164,165 up to eight contact pads 63 for signal transmission are present around a center contact pad 64, 65 that is either a pad for ground or for voltage supply. In this manner a signal path and its signal return can be neighboring, and hence the distance between both is minimal. This enforces a proper transmission path for the carrier substrate 20 to an external carrier.

Figure 6:
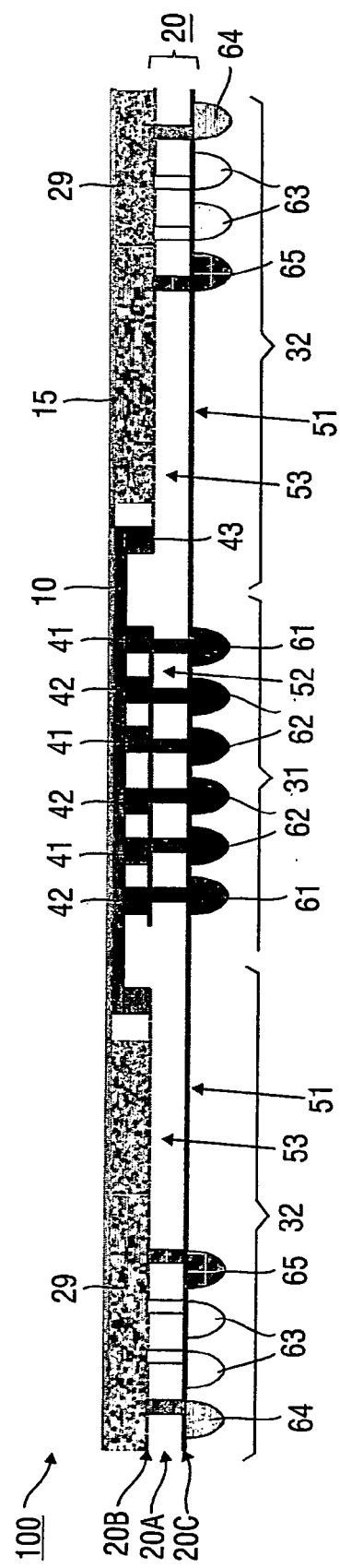
FIG. 6 shows diagrammatically a cross-sectional view of a second embodiment of the device.
Figure 7:
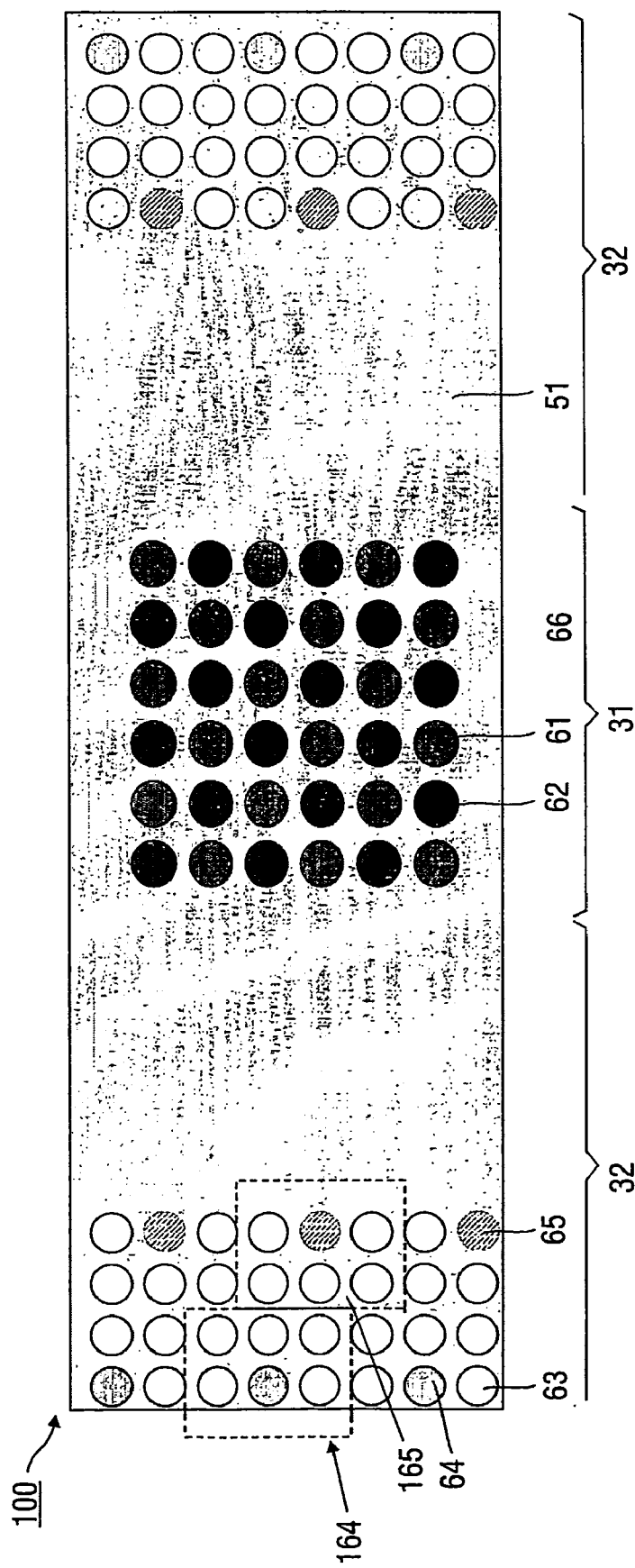
FIG. 7 shows diagrammatically a bottom view of the second embodiment.
Figure 8:
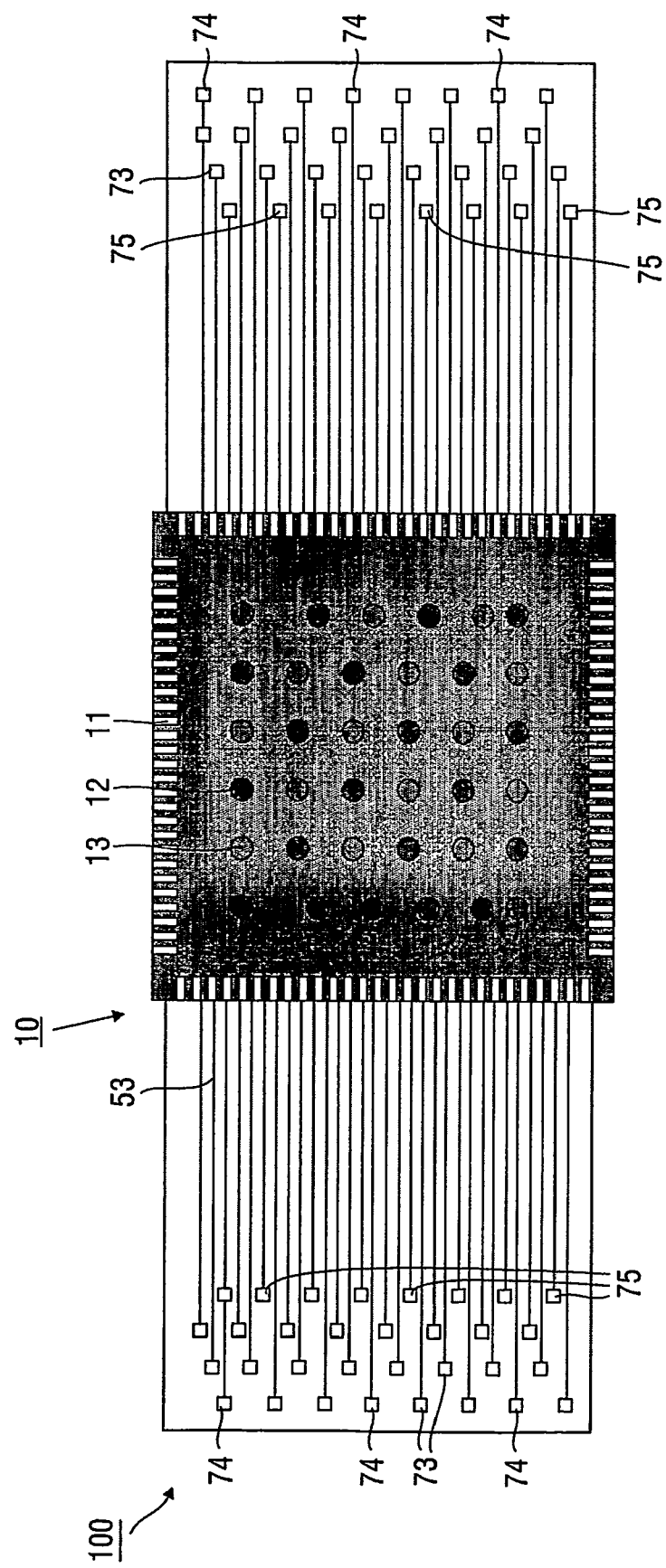
FIG. 8 shows diagrammatically a top view of the second embodiment.

FIG. 6 shows a cross-sectional view of a second embodiment of the device 100 of the invention. FIG. 7 shows the device 100 of this second embodiment from the second side of the carrier substrate 20, where the contact pads 61-65 for external connection are present. FIG. 8 shows the integrated circuit 10 of this second embodiment with its side 18 with bond pads 11-13. It is observed that in FIG. 7 only part of the substrate is shown; the substrate usually extends laterally, and the contact pads 63-65 generally form a closed ring around the integrated circuit. As a result, the embodiment is an example of a typical ball grid array package, as the skilled person will understand. Such a package is preferred, but the invention is not limited thereto. It is furthermore observed that FIG. 6 is not a true cross section, as the skilled person will find out on comparison with FIG. 7.

The device 100 of this second embodiment is equal in many features to that of the first embodiment. In both cases, the carrier substrate 20 is subdivided into a core area 31 and a peripheral area 32. In both cases, the carrier substrate 20 is provided with a ground plane 51 on the second side 22 of the substrate, extending in the peripheral area 32, and with interconnects 53, that have a transmission line character. It is observed that in both cases the bond pads 43 for the peripheral functionality are provided near to the edge of the core area 31, such that the transmission lines are well defined and their behavior not negatively affected by bond wires or the like.

The main difference between the first and the second embodiment resides in that the second embodiment is a flip-chip embodiment. This has substantial advantages. First of all, there is no need for an additional bond pad layer on the first side 21 of the carrier substrate 20, which is needed for the wirebonding. There is no need for a redistribution layer (i.e. through the interconnects 66, 67) or a staggered pad array either. The solder balls between the bond pads 11,12, 13 of the integrated circuit and the bond pads 41, 42, 43 at the carrier substrate 20 can be provided directly on the electrically conductive layer 20B.

Secondly, both contact pads 61,62, as well as the corresponding bond pads 41,42 and 11,12 are arranged in a 'chessboard'-pattern. In such a pattern each closest neighbor of a pad for voltage supply 12,42,62 is a pad for ground 11,41,61 and vice versa Consequently, the ball grid array has a coaxial structure, with a reduction of the effective inductance of about 50%, and a lower ground bounce voltage. The bond pads 11,12 at the integrated circuit 10 are in this case provided in an inner area. These pads 11,12 demonstrate—seen in perpendicular projection on the substrate of the integrated circuit—an overlap with the active region. Such a design of bond pads is also known as bond pads on active areas (They may be provided on top of a passivation layer, in order to provide sufficient strength.

Thirdly, due to the good conductivity (low impedance, low losses) of the interconnect of the core voltage supply in the carrier substrate, the number of ESD protection structures can be reduced. In fact, they are needed only at the outer edge of the core area 31. This is based on the insight that the voltage gradient in the core area 31 shall be minimal during ESD stress, as a consequence of the good conductivity. For the ground connections, ESD protection structures are needed in the core area 31 and in the peripheral area 32.

Fourthly, the thermal management of the device 100 can be improved in that a heat spreading layer 15 is provided on the first side 21 of the carrier substrate and the backside of the integrated circuit 10, e.g. the side facing away from the bond pads 11-13. It is particularly preferred that the semiconductor substrate of the integrated circuit 10 is thinned, thereby reducing the path of thermal resistance to the heat spreading layer 15.

In short, the electronic device 100 comprises a semiconductor device, particularly an integrated circuit 10 and a carrier substrate 20 with a bottom and top conductive layer, and is provided with voltage supply, ground and signal transmission connections. In order to enable the use of more than one supply voltage, the integrated circuit 10 is subdivided into core functionality 110 and peripheral functionality 210, and the carrier substrate 20 is subdivided into a corresponding core area 31 and peripheral area 32. The ground connections of both core and periphery are mutually coupled through an interconnect 22 in the carrier substrate 20. This interconnect is particularly a ground plane, and allows the provision of a transmission line character to the interconnects for signal transmission for the periphery.

LIST OF REFERENCE NUMERALS

10 integrated circuit
11 bond pads of integrated circuit $V_{dd,\ perif}$ I/O path
12 bond pads of integrated circuit for voltage supply for core functionality $V_{dd,\ core}$
13 bond pads of integrated circuit for ground (of core functionality) $V_{ss}$
15 heat spreading layer
18 (first) side of integrated circuit
19 layer of adhesive
20 carrier substrate
20A dielectric layer of carrier substrate
20B electrically conducting layer on first side of carrier substrate
20C electrically conducting layer on second side of carrier substrate
21 first side of carrier substrate
22 second side of carrier substrate
29 stiffner/stiffening layer
31 core area
32 peripheral area
41 bond pad at carrier substrate for ground (for core functionality) $V_{ss,}$
42 bond pad at carrier substrate for voltage supply for core functionality $V_{dd,\ core}$
43 bond pad at carrier substrate for voltage supply for peripheral functionality $V_{dd,\ perif}$ and for I/O path
49 bond wires
51 ground plane in peripheral area on second side of carrier substrate 52 ground plane in core area on first side of carrier substrate
53 transmission lines (interconnects with transmission line character)
61 contact pad (and solder ball) for ground for core functionality $V_{ss,\ core}$
62 contact pad (and solder ball) for voltage supply for core functionality $V_{dd,\ core}$
63 contact pad (and solder ball) for signal transmission I/O
64 contact pad (and solder ball) for ground for peripheral functionality $V_{ss,\ perif}$
65 contact pad (and solder ball) for ground or voltage supply for peripheral functionality $V_{ss,\ perif}, V_{dd,\ perif}$
66 vertical interconnect
67 lateral interconnect
73 vertical interconnects leading to contact pads for signal transmission
74 vertical interconnects leading to contact pads for ground in peripheral area $V_{ss,\ perif}$
75 vertical interconnects leading to contact pads for ground or voltage supply in peripheral area $V_{ss,\ perif}, V_{dd,\ perif}$
100 electronic device
164 subgroup of contact pads with one center pad for ground
165 subgroup of contact pads with one center pad for ground or voltage supply
110 core functionality of the semiconductor device 10
111 decoupling capacitor
112 active elements in the core
210 peripheral functionality of the semiconductor device 10
211 means for decoupling, particularly a decoupling capacitor
212 active elements in the periphery
301 voltage source
302 inductor
303 load capacitor

The invention claimed is:

1. An electronic device comprising:
at least one semiconductor device provided, on a side, with a plurality of bond pads; and
a carrier substrate comprising a layer of electrically insulating material and having a first side and an opposed second side, the first side and the opposed second side are each provided with an electrically conductive layer, on which first side bond pads are present which are suitable for coupling to the bond pads of the at least one semiconductor device, and on which second side contact pads for external coupling are provided, the contact pads and the bond pads being electrically interconnected according to a desired pattern, a first portion of the contact pads being defined for ground connection, a second portion of the contact pads being defined for voltage supply connection and a third portion of the contact pads being defined for signal transmission, in said electronic device
the at least one semiconductor device is provided with core functionality and peripheral functionality, the core functionality and the peripheral functionality each being provided with voltage supply connection and ground connection,
the carrier substrate is laterally subdivided into a core area and a peripheral area, in which core area the contact pads for the core functionality are provided and in which peripheral area the contact pads for the peripheral functionality are provided, wherein
the carrier substrate comprises at least one interconnect for interconnecting the ground connections of the peripheral functionality and the core functionality, and means for decoupling the voltage supply of core and peripheral functionality to the common around are present,
wherein the means for decoupling comprise a decoupling capacitor in the peripheral functionality, which is located either in the at least one semiconductor device or at the carrier substrate.

2. An electronic device as claimed in claim 1, wherein the peripheral area is located around the core area;
a ground plane is defined in the peripheral area on the second side of the carrier substrate, which ground plane is the interconnect for mutually interconnecting the ground connections of the peripheral functionality and the core functionality, and
interconnects between the contact pads and the bond pads of the peripheral functionality are defined on the first side of the carrier substrate, which interconnects have a transmission line character.

3. An electronic device as claimed in claim 1, wherein the contact pads in the core area are defined in an array, the pads for ground connection and for supply connection being arranged in the array such that each of the pads for ground connection has pads for supply connections as the closest neighbor pads.

4. An electronic device as claimed in claim 1, wherein the contact pads in the peripheral area are defined in subgroups, each subgroup comprising one contact pad for voltage connection or one contact pad for ground connection, and several contact pads for signal transmission, all of the pads for signal transmission having the contact pad for either voltage or ground connection as a neighboring pad.

5. An electronic device as claimed in claim 1, wherein a ground plane is defined, in the core area, on the first side of the carrier substrate and is coupled to the ground plane in the peripheral area through vertical interconnects.

6. An electronic device as claimed in claim 1, wherein a stiffening layer is present on the first side of the carrier substrate, thereby covering part of the electrically conductive layer.

7. An electronic device comprising:
at least one semiconductor device provided, on a side, with a plurality of bond pads; and
a carrier substrate comprising a layer of electrically insulating material and having a first side and an opposed second side, the first side and the opposed second side are each provided with an electrically conductive layer, on which first side bond pads are present which are suitable for coupling to the bond pads of the at least one semiconductor device, and on which second side contact pads for external coupling are provided, the contact pads and the bond pads being electrically interconnected according to a desired pattern, a first portion of the contact pads being defined for ground connection, a second portion of the contact pads being defined for voltage supply connection and a third portion of the contact pads being defined for signal transmission, in said electronic device
the at least one semiconductor device is provided with core functionality and peripheral functionality, the core functionality and the peripheral functionality each being provided with voltage supply connection and ground connection,
the carrier substrate is laterally subdivided into a core area and a peripheral area, in which core area the contact pads for the core functionality are provided and in which peripheral area the contact pads for the peripheral functionality are provided, wherein the carrier substrate comprises at least one interconnect for interconnecting the ground connections of the peripheral functionality and the core functionality, and means for decoupling the voltage supply of core and peripheral functionality to the common ground are present, wherein the semiconductor device is placed on the carrier substrate in a flip chip orientation, the bond pads at the semiconductor device and on the first side of the carrier substrate being positioned in a corresponding configuration, and wherein a heat spreading layer is provided on the first side of the carrier substrate and on a side of the semiconductor device facing away from the side of the bond pads.

8. An electronic device comprising:

at least one semiconductor device provided, on a side, with a plurality of bond pads; and a carrier substrate comprising a layer of electrically insulating material and having a first side and an opposed second side, the first side and the opposed second side are each provided with an electrically conductive layer, on which first side bond pads are present which are suitable for coupling to the bond pads of the at least one semiconductor device, and on which second side contact pads for external coupling are provided, the contact pads and the bond pads being electrically interconnected according to a desired pattern, a first portion of the contact pads being defined for ground connection, a second portion of the contact pads being defined for voltage supply connection and a third portion of the contact pads being defined for signal transmission, in said electronic device the at least one semiconductor device is provided with core functionality and peripheral functionality, the core functionality and the peripheral functionality each being provided with voltage supply connection and ground connection, the carrier substrate is laterally subdivided into a core area and a peripheral area, in which core area the contact pads for the core functionality are provided and in which peripheral area the contact pads for the peripheral functionality are provided, wherein the carrier substrate comprises at least one interconnect for interconnecting the ground connections of the peripheral functionality and the core functionality, and means for decoupling the voltage supply of core and peripheral functionality to the common ground are present, and further provided with a supply series inductor.

* * * * *